(12) United States Patent
Kim et al.

(10) Patent No.: US 12,696,406 B2
(45) Date of Patent: Jul. 28, 2026

(54) PROTECTIVE FILM, DISPLAY DEVICE INCLUDING THE PROTECTIVE FILM, AND METHOD OF MANUFACTURING THE PROTECTIVE FILM

(71) Applicants: Samsung Display Co., Ltd., Yongin-si (KR); INNO F C CO., LTD., Ansan-si (KR)

(72) Inventors: Sung Kim, Yongin-si (KR); Hyungdon Na, Yongin-si (KR); Seungkyu Lee, Yongin-si (KR); Kapje Jeon, Yongin-si (KR); Bumsuk Ro, Gunpo-si (KR); Yongseok Park, Ansan-si (KR); Donghyeok Oh, Suwon-si (KR); Jaeduck Jung, Siheung-si (KR); Kyoungseok Cho, Suwon-si (KR)

(73) Assignees: Samsung Display Co., Ltd., Yongin-si (KR); INNO F&C CO., LTD., Ansan-si (KR)

( * ) Notice: Subject to any disclaimer, the term of this patent is extended or adjusted under 35 U.S.C. 154(b) by 199 days.

(21) Appl. No.: 18/515,127

(22) Filed: Nov. 20, 2023

(65) Prior Publication Data

US 2024/0172381 A1　May 23, 2024

(30) Foreign Application Priority Data

Nov. 21, 2022　(KR) ........................ 10-2022-0156788

(51) Int. Cl.
　　*H05K 5/03*　　　(2006.01)
　　*B32B 1/00*　　　(2024.01)
　　　　　　(Continued)

(52) U.S. Cl.
　CPC ................. *H05K 5/03* (2013.01); *B32B 1/00* (2013.01); *B32B 7/12* (2013.01); *B32B 27/36* (2013.01);
　　　　　　(Continued)

(58) Field of Classification Search
　CPC .... H05K 5/03; B32B 1/00; B32B 7/12; B32B 27/36; B32B 2255/10; B32B 2255/26;
　　　　　　(Continued)

(56) References Cited

U.S. PATENT DOCUMENTS

| | | | |
|---|---|---|---|
| 10,078,174 B2 * | 9/2018 | You ...................... | G02B 6/0038 |
| 2015/0015812 A1 * | 1/2015 | Takakusagi ........... | G06F 3/0444 |
| | | | 349/12 |

(Continued)

FOREIGN PATENT DOCUMENTS

| | | |
|---|---|---|
| JP | 6435601 B2 | 12/2018 |
| JP | 2019-082648 A | 5/2019 |

(Continued)

OTHER PUBLICATIONS

JP 2019-109517 machine translation (Year: 2019).*
JP 6537263 machine translation (Year: 2019).*

*Primary Examiner* — Blaine Copenheaver
(74) *Attorney, Agent, or Firm* — Womble Bond Dickinson (US) LLP

(57) ABSTRACT
A protective film, a display device including the protective film and a method of manufacturing the protective film are provided. The protective film includes a urethane adhesive layer including a urethane adhesive resin, a base film layer on the urethane adhesive layer, and a hard coating layer on the base film layer and including a fluorine-based photocurable resin and a glycol-based photocurable resin.

28 Claims, 5 Drawing Sheets

(51) Int. Cl.
　　*B32B 7/12*　　　　(2006.01)
　　*B32B 27/36*　　　(2006.01)
　　*C09J 175/04*　　　(2006.01)

(52) U.S. Cl.
　　CPC ......... *C09J 175/04* (2013.01); *B32B 2255/10*
　　　　(2013.01); *B32B 2255/26* (2013.01); *B32B*
　　　*2255/28* (2013.01); *B32B 2307/414* (2013.01);
　　　　*B32B 2307/7376* (2023.05); *B32B 2307/748*
　　　　　(2013.01); *B32B 2457/20* (2013.01)

(58) Field of Classification Search
　　CPC .......... B32B 2255/28; B32B 2307/414; B32B
　　　　　2307/7376; B32B 2307/748; B32B
　　　　2457/20; C09J 175/04; C09J 7/20; C09J
　　　　7/30; C09J 7/401; C08J 7/046; G09F
　　　　　　　　　　　　　　9/301
　　See application file for complete search history.

(56)　　　　　　　　References Cited

U.S. PATENT DOCUMENTS

2018/0215883　A1 *　8/2018　Park ..................... C08J 7/0423
2021/0179487　A1 *　6/2021　Kim ..................... C09D 5/002

FOREIGN PATENT DOCUMENTS

| | | | | |
|---|---|---|---|---|
| JP | 6537263 | B2 * | 7/2019 | .............. B05D 1/36 |
| JP | 2019109517 | A　* | 7/2019 | ............. H10K 59/40 |
| KR | 10-1697049 | B1 | 1/2017 | |
| KR | 10-2185698 | B1 | 12/2020 | |
| WO | WO-2018062328 | A1 * | 4/2018 | .............. G02B 1/11 |

* cited by examiner

PROTECTIVE FILM, DISPLAY DEVICE INCLUDING THE PROTECTIVE FILM, AND METHOD OF MANUFACTURING THE PROTECTIVE FILM

CROSS-REFERENCE TO RELATED APPLICATION

This application claims priority to and the benefit of Korean Patent Application No. 10-2022-0156788, filed on Nov. 21, 2022, in the Korean Intellectual Property Office, the entire disclosure of which is hereby incorporated by reference.

BACKGROUND

1. Field

One or more embodiments relate to a protective film, a display device including the protective film, and a method of manufacturing the protective film.

2. Description of the Related Art

Mobile electronic devices are widely used. As mobile electronic devices, notebook computers and tablet personal computers (PC) have become widely used in recent years, in addition to small electronic devices such as mobile phones.

Such a mobile electronic device includes a display device that provides various functions, for example, providing visual information, such as an image or a video, to a user. Recently, a method of adding various functions to a display area of a display device while expanding the display area has been studied.

A display device may include a cover window protecting a display panel of the display device and a protective film on the cover window. A cross-section of the cover window may have a flat shape, a shape including a curved surface, and/or the like, and a shape applied to a foldable display can be flexibly bent or folded, and/or the like. In this way, as the cross-section of the cover window changes to conform to these various forms, changes to the adhesive strength, shape, and/or configuration of the protective film for protecting the cover window have also been developed and/or are desired.

SUMMARY

Aspects of one or more embodiments of the present disclosure are directed toward a protective film configured to effectively protect a cover window. However, this objective is an example, and the present disclosure is not limited thereto.

Additional aspects will be set forth in part in the description which follows and, in part, will be apparent from the description, or may be learned by practice of the presented embodiments of the disclosure.

According to one or more embodiments of the present disclosure, a protective film includes a urethane adhesive layer including a urethane adhesive resin, a base film layer on the urethane adhesive layer, and a hard coating layer on the base film layer and including a fluorine-based photocurable resin and a glycol-based photocurable resin.

In one or more embodiments, the hard coating layer may include a urethane photocurable resin and a propane-based photocurable resin.

In one or more embodiments, based on a total weight of the hard coating layer, a weight ratio of the fluorine-based photocurable resin may be in a range of about 3 wt % to about 10 wt %, a weight ratio of the glycol-based photocurable resin may be in a range of about 1 wt % to about 8 wt %, a weight ratio of the urethane photocurable resin may be in a range of about 10 wt % to about 50 wt %, and a weight ratio of the propane-based photocurable resin may be in a range of about 1 wt % to about 15 wt %.

In one or more embodiments, a thickness of the base film layer may be in a range of about 15 µm to about 100 µm.

In one or more embodiments, a thickness of the hard coating layer may be less than a thickness of the base film layer.

In one or more embodiments, the thickness of the hard coating layer may be in a range of about 1 µm to about 10 µm.

In one or more embodiments, the protective film may further include a lower exfoliation layer below the urethane adhesive layer.

In one or more embodiments, the lower exfoliation layer may include a synthetic resin material film layer and a release coating layer on the synthetic resin material film layer.

In one or more embodiments, the protective film may further include an upper exfoliation layer on the hard coating layer.

In one or more embodiments, the urethane adhesive resin may include a polyol having a molecular weight in a range of about 400 to about 1000.

In one or more embodiments, the urethane adhesive resin may include a polyol having four functional groups.

According to one or more embodiments, a display device includes a display panel, a cover window on the display panel, and a protective film on the cover window, wherein the protective film includes a urethane adhesive layer including a urethane adhesive resin, a base film layer on the urethane adhesive layer, and a hard coating layer on the base film layer and including a fluorine-based photocurable resin and a glycol-based photocurable resin.

In one or more embodiments, the display panel may include a flat area and a curved area bent outside the flat area.

In one or more embodiments, the hard coating layer may include a urethane photocurable resin and a propane-based photocurable resin.

In one or more embodiments, based on a total weight of the hard coating layer, a weight ratio of the fluorine-based photocurable resin may be in a range of about 3 wt % to about 10 wt %, a weight ratio of the glycol-based photocurable resin may be in a range of about 1 wt % to about 8 wt %, a weight ratio of the urethane photocurable resin may be in a range of about 10 wt % to about 50 wt %, and a weight ratio of the propane-based photocurable resin may be in a range of about 1 wt % to about 15 wt %.

In one or more embodiments, a thickness of the base film layer may be in a range of about 15 µm to about 100 µm.

In one or more embodiments, a thickness of the hard coating layer may be less than a thickness of the base film layer.

In one or more embodiments, the urethane adhesive resin may include a polyol having a molecular weight in a range of about 400 to about 1000.

In one or more embodiments, the urethane adhesive resin may include a polyol having four functional groups.

According to one or more embodiments of the present disclosure, a method of manufacturing a protective film includes preparing a base film layer, forming a hard coating layer on the base film layer, the hard coating layer including a fluorine-based photocurable resin and a glycol-based photocurable resin, and forming a urethane adhesive layer below the base film layer.

In one or more embodiments, the forming of the hard coating layer may include manufacturing a hard coating composition including the fluorine-based photocurable resin, the glycol-based photocurable resin, a urethane photocurable resin, a propane-based photocurable resin, a solvent, and a photoinitiator, coating the hard coating composition on the base film layer, and ultraviolet (UV)-photocuring the coated hard coating composition.

In one or more embodiments, based on a total weight of the hard coating composition, a weight ratio of the fluorine-based photocurable resin may be in a range of about 3 wt % to about 10 wt %, a weight ratio of the glycol-based photocurable resin may be in a range of about 1 wt % to about 8 wt %, a weight ratio of the urethane photocurable resin may be in a range of about 10 wt % to about 50 wt %, a weight ratio of the propane-based photocurable resin may be in a range of about 1 wt % to about 15 wt %, a weight ratio of the solvent may be in a range of about 30 wt % to about 80 wt %, and a weight ratio of the photoinitiator may be in a range of about 0.5 wt % to about 10 wt %.

In one or more embodiments, the hard coating composition may be coated on the base film layer by a micro gravure coating operation.

In one or more embodiments, the forming of the urethane adhesive layer may include manufacturing a urethane adhesive composition including a urethane adhesive resin and a urethane adhesive curing agent, coating the urethane adhesive composition on a lower portion of the base film layer, and thermally curing the coated urethane adhesive composition.

In one or more embodiments, the urethane adhesive composition may be coated on the lower portion of the base film layer by a slot die coating operation.

In one or more embodiments, the urethane adhesive resin may include polypropylene glycol, hexamethylene diisocyanate (HDI), a catalyst, and a solvent, and the urethane adhesive curing agent may include at least one of an aliphatic polyisocyanate derived from hexamethylene diisocyanate (HDI) (e.g., CORONATE® and DURANATE®24A-100), an aliphatic polyisocyanate derived from isophorone diisocyanate (IPDI) (e.g., DESMODUR® Z 4470), or an aromatic polyisocyanate derived from toluene diisocyanate (TDI) (e.g., KONNATE® L-75).

In one or more embodiments, the method may further include forming a lower exfoliation layer below the urethane adhesive layer, and forming an upper exfoliation layer on the hard coating layer.

In one or more embodiments, the forming of the lower exfoliation layer may include preparing a synthetic resin material film layer, and forming a release coating layer by coating a silicone release agent on the synthetic resin material film layer with a slot die coater.

BRIEF DESCRIPTION OF THE DRAWINGS

The above and other aspects, features, and/or principles of embodiments of the present disclosure will be more apparent from the following description taken in conjunction with the accompanying drawings, in which.

DETAILED DESCRIPTION

Figure 1:
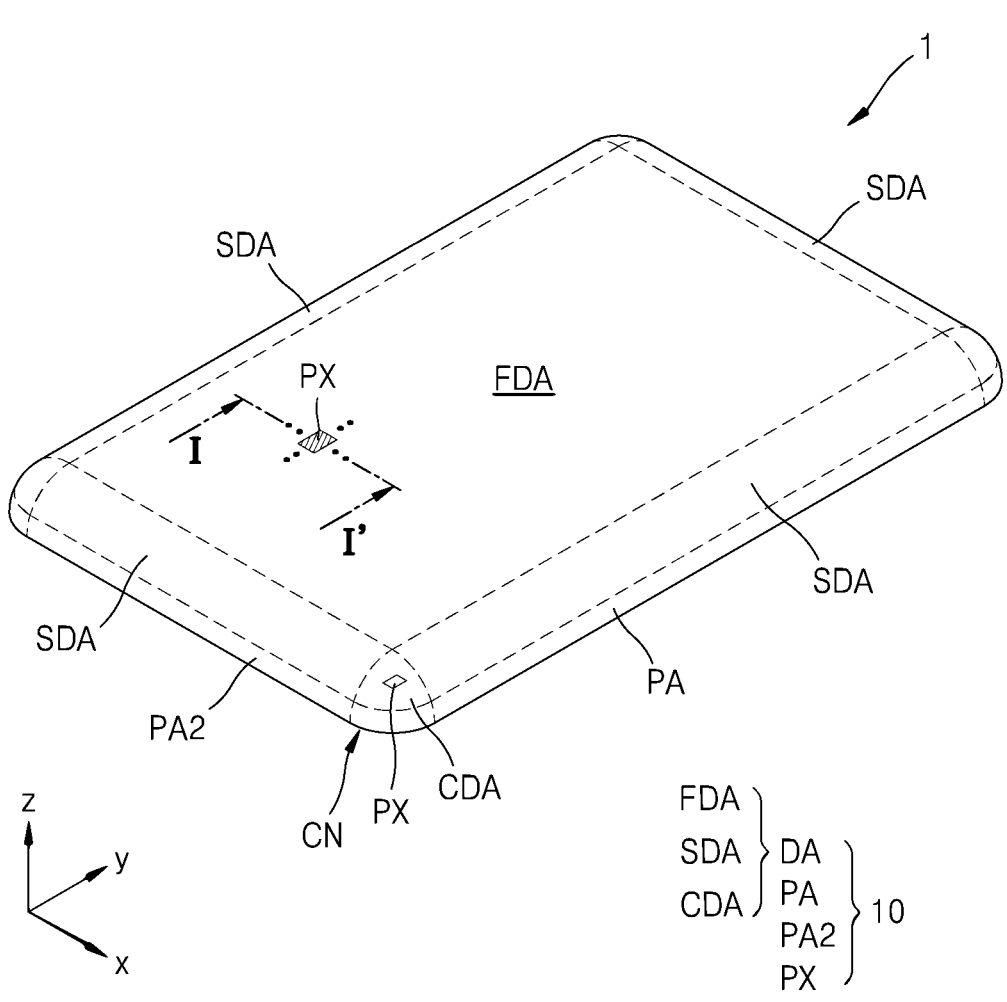
FIG. 1 is a schematic perspective view of a display device according to one or more embodiments of the present disclosure.

The present disclosure may be modified in many alternate forms, and thus specific embodiments will be illustrated in the drawing and described in more detail. It should be understood, however, that it is not intended to limit the present disclosure to the particular forms disclosed, but rather, is intended to cover all modifications, equivalents, and alternatives falling within the spirit and scope of the present disclosure.

Reference will now be made in more detail to embodiments, examples of which are illustrated in the accompanying drawings, wherein like reference numerals refer to like elements throughout, and duplicative descriptions thereof may not be provided. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

As used herein, the term "and/or" includes any and all combinations of one or more of the associated listed items. Expressions such as "at least one of," "a plurality of," "one of," and other prepositional phrases, when preceding a list of elements, should be understood as including the disjunctive if written as a conjunctive list and vice versa. For example, the expressions "at least one of a, b, or c," "at least one of a, b, and/or c," "one selected from the group consisting of a, b, and c," "at least one selected from a, b, and c," "at least one from among a, b, and c," "one from among a, b, and c", "at least one of a to c" indicates only a, only b, only c, both a and b, both a and c, both b and c, all of a, b, and c, or variations thereof.

As the disclosure allows for various changes and numerous embodiments, particular embodiments will be illustrated in the drawings and described in more detail in the written description. Effects and features of the disclosure and methods of achieving the same will be apparent with reference to embodiments and drawings described below in more detail. The disclosure may, however, be embodied in many different forms and should not be construed as being limited to the embodiments set forth herein.

The present disclosure will now be described more fully with reference to the accompanying drawings, in which example embodiments of the present disclosure are shown. Like reference numerals in the drawings denote like elements, and thus their description will not be provided.

As used herein, the singular forms "a," "an" and "the" are intended to include the plural forms as well, unless the context clearly indicates otherwise.

It will be further understood that the terms "have," "having," "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element or layer is referred to as being "on," or "connected to," another element or layer, it can be directly on, connected to, or coupled to the other element or layer, or one or more intervening elements or layers may be present. For example, it will be understood that when a layer, region, or component is referred to as being electrically connected to another layer, region, or component, it can be directly or indirectly electrically connected to the other layer, region, or component. That is, for example, intervening layers, regions, or components may be present. In addition, it will also be understood that when an element or layer is referred to as being "between" two elements or layers, it can be the only element or layer between the two elements or layers, or one or more intervening elements or layers may also be present.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are illustrated for convenience of explanation, the present disclosure is not limited thereto.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Figure 2:
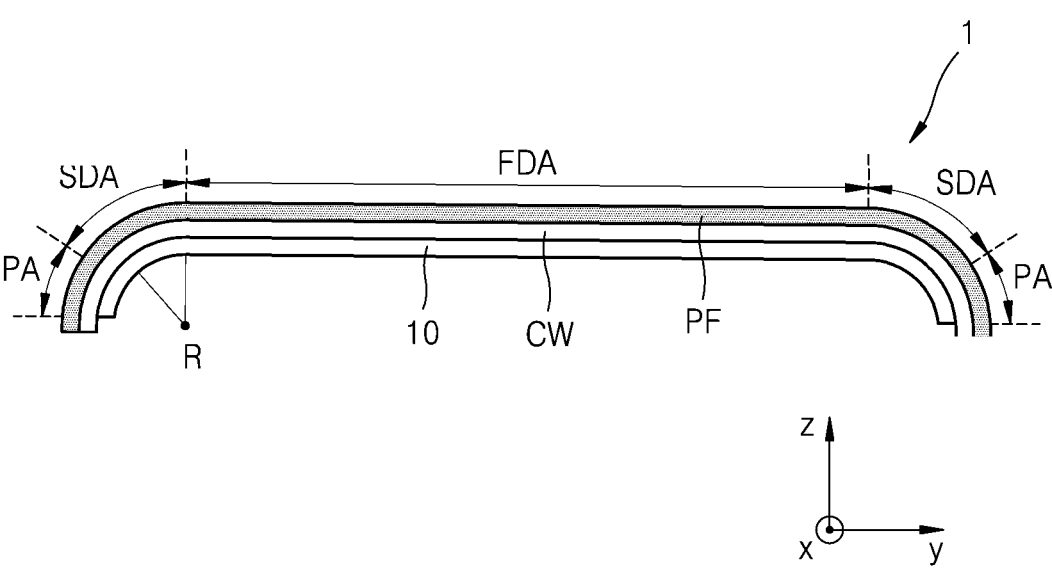
FIG. 2 is a schematic cross-sectional view of a display device according to one or more embodiments of the present disclosure.

FIG. 1 is a schematic perspective view of a display device according to one or more embodiments of the present disclosure. FIG. 2 is a schematic cross-sectional view of a display device according to one or more embodiments of the present disclosure. FIG. 2 schematically illustrates the cross-section of the display device in a y-axis direction.

Referring to FIGS. 1 and 2, a display device 1 may include a display panel 10, a cover window CW on the display panel 10, and a protective film PF on the cover window CW.

The display device 1 is a device which displays a video or a still image, and may be a portable electronic device, such as a mobile phone, a smart phone, a tablet personal computer (PC), a mobile communication terminal, an electronic notebook, an electronic book, a portable multimedia player (PMP), a navigation device, an Ultra Mobile PC (UMPC), and/or the like. The display device 1 may be an electronic device, such as a television, a laptop computer, a monitor, a billboard, an Internet of Things (IoT) device, and/or the like. In one or more embodiments, the display device 1 may be a wearable device such as a smart watch, a watch phone, a glasses-type or kind display, or a head-mounted display (HMD). In one or more embodiments, the display device 1 may be a portion of another device. For example, the display device 1 may be a display unit of an electronic device. In one or more embodiments, the display device 1 may be a dashboard of a vehicle, a center fascia of a vehicle or a center information display (CID) disposed on a dashboard, a rear-view mirror display replacing a side mirror of a vehicle, and/or a display unit disposed on a back surface of a front seat as entertainment for a passenger in a back seat of a vehicle.

The display device 1 may have one or more suitable shapes, for example, a rectangular plate shape having two pairs of sides respectively parallel to each other. In one or more embodiments, for convenience of description, a case where the display device 1 has a rectangular shape having a pair of long sides and a pair of short sides is shown, but the shape of the display device 1 is not limited thereto, and may have one or more suitable shapes. For example, the display device 1 may be provided in one or more suitable shapes, such as a closed polygon shape including straight sides, a circle or an ellipse including curved sides, or a semicircle or half ellipse including straight and curved sides.

In one or more embodiments, when the display device 1 has straight sides, at least some of the edges of each shape may be curved. For example, when the display device 1 has a rectangular shape, a portion where adjacent straight sides meet each other may be replaced with a curved line having a certain curvature. For example, a vertex portion of the rectangular shape may include a curved side having a certain curvature and having both ends adjacent to each other connected to two adjacent linear sides. Here, the curvature may be set differently according to the position of the curved side. For example, the curvature may be changed depending on the starting position of a curve line, the length of the curve line, and/or the like. Hereinafter, one or more embodiments in which the display device 1 has a rectangular shape having a pair of long sides and a pair of short sides is described in more detail.

In one or more embodiments, the display device 1 may have long sides in a first direction and short sides in a second direction. Here, the first direction and the second direction may be directions intersecting with each other. For example, the first direction and the second direction may form an acute angle with each other. As another example, the first direction and the second direction may form an obtuse angle with each other, or may form a right angle with each other. Hereinafter, a case where the first direction (e.g., a y direction or –y direction) and the second direction (e.g., an x direction or −x direction) form a right angle with each other is mainly described in more detail.

In one or more embodiments, in the display device 1, the length of sides in the first direction (e.g., the y direction or −y direction) may be equal to the length of sides in the second direction (e.g., the x direction or −x direction). In one or more embodiments, the display device 1 may have long sides in the first direction (e.g., the y direction or −y direction) and short sides in the second direction (e.g., the x direction or −x direction).

A corner where a long side in the first direction (e.g., the y direction or -y direction) meets a short side in the second direction (e.g., the x direction or −x direction) may be rounded to have a certain curvature.

The display panel 10 may include a plurality of pixels PX. As shown in FIG. 1, the display panel 10 may include a display area DA displaying an image and a peripheral area PA and PA2 around (e.g., surrounding) the display area DA outside the display area DA. The plurality of pixels PX may be arranged in the display area DA, and the plurality of pixels PX may display an image. Each of the plurality of pixels PX may include sub-pixels. For example, each of the plurality of pixels PX may include a red sub-pixel, a green sub-pixel, and a blue sub-pixel. In one or more embodiments, each of the plurality of pixels PX may include a red sub-pixel, a green sub-pixel, a blue sub-pixel, and a white sub-pixel.

The display area DA may include a front surface display area FDA, a side surface display area SDA, and a corner display area CDA. The plurality of pixels PX arranged in each display area DA may display an image. In one or more embodiments, the pixels PX in the front surface display area FDA, the side surface display area SDA, and the corner display area CDA may respectively provide independent images. In one or more embodiments, the pixels PX in the front surface display area FDA, the side surface display area SDA, and the corner display area CDA may respectively provide portions of any one image.

The front surface display area FDA is a flat display area, and may be referred to as a flat area. A pixel PX including a display element may be arranged in the front surface display area FDA. In one or more embodiments, the front surface display area FDA may provide most of the image or images.

A pixel PX including a display element may be arranged in the side surface display area SDA. Accordingly, the side surface display area SDA may display an image. The side surface display area SDA may be disposed on a side of the front surface display area FDA with a corner CN therebetween (e.g., with the corner CN between two adjacent peripheral areas PA2 and PA of the display device 1 and between the adjacent side surface display areas SDA of display area DA). The side surface display area SDA has a radius of curvature R and may be bent (to thus, e.g., provide a curve and/or corner edge display).

The corner display area CDA may be arranged in or at the corner CN of the display panel 10. For example, the corner display area CDA may be arranged corresponding to the corner CN. Here, the corner CN may be a portion where a long side of the display device 1 and/or the display panel 10 in the first direction (e.g., the y direction or −y direction) meets a short side thereof in the second direction (e.g., the x direction or −x direction). The corner display area CDA may be between neighboring side surface display areas SDA. The side surface display area SDA and the corner display area CDA may at least partially surround the front surface display area FDA and may be bent.

The display panel 10 may include a flat area and a curved area. The front surface display area FDA is the display area DA which is flat, and may be referred to as a flat area. The side surface display area SDA, the corner display area CDA, and the peripheral area PA and PA2 are areas each having a curvature and bent from the outside (e.g., from an outside edge) of the front surface display area FDA, and may be referred to as curved areas.

As shown in FIG. 2, the display panel 10 may be disposed below the cover window CW. In one or more embodiments, the display panel 10 may be attached to the cover window CW by a transparent adhesive member, such as an optically clear adhesive (OCA) film.

The cover window CW may be a flexible window. The cover window CW may protect the display panel 10 while being easily bent by an external force without the occurrence of cracks and/or the like. As shown in FIG. 2, the cover window CW may have a flat shape in an area overlapping the flat area of the display panel 10, and may have a bent shape in an area overlapping the curved area of the display panel 10. For example, the cover window CW may have a curved shape in an area overlapping the side surface display area SDA and the peripheral area PA of the display panel 10.

The cover window CW may include glass, sapphire, or plastic. The cover window CW may be, for example, ultra thin glass (UTG) or colorless polyimide (CPI). In one or more embodiments, the cover window CW may have a structure in which a flexible polymer layer is disposed on one surface of a glass substrate, or may only include a polymer layer.

A protective film PF may be disposed on the cover window CW. The protective film PF may protect the surface of the cover window CW. The protective film PF may be disposed on the cover window CW to have a bent shape along the bent shape of the cover window CW. As in FIG. 2, the protective film PF may have a flat shape in an area overlapping the flat area of the display panel 10, and may have a bent shape in an area overlapping the curved area of the display panel 10. The protective film PF may have a flat shape in an area overlapping the flat portion of the cover window CW, and may have a bent shape in an area overlapping the bent portion of the cover window CW.

Although FIG. 2 shows a cross-section of the display device 1 in the y-axis direction, this is an example. A cross-section of the display device 1 in an x-axis direction may be provided, and the display device 1 may have a shape similar to that shown in FIG. 2. For example, in the cross-section of the display device 1 in the x-axis direction, the cover window CW and the protective film PF may each have a bent shape in an area overlapping the curved area of the display panel 10.

Figure 3:
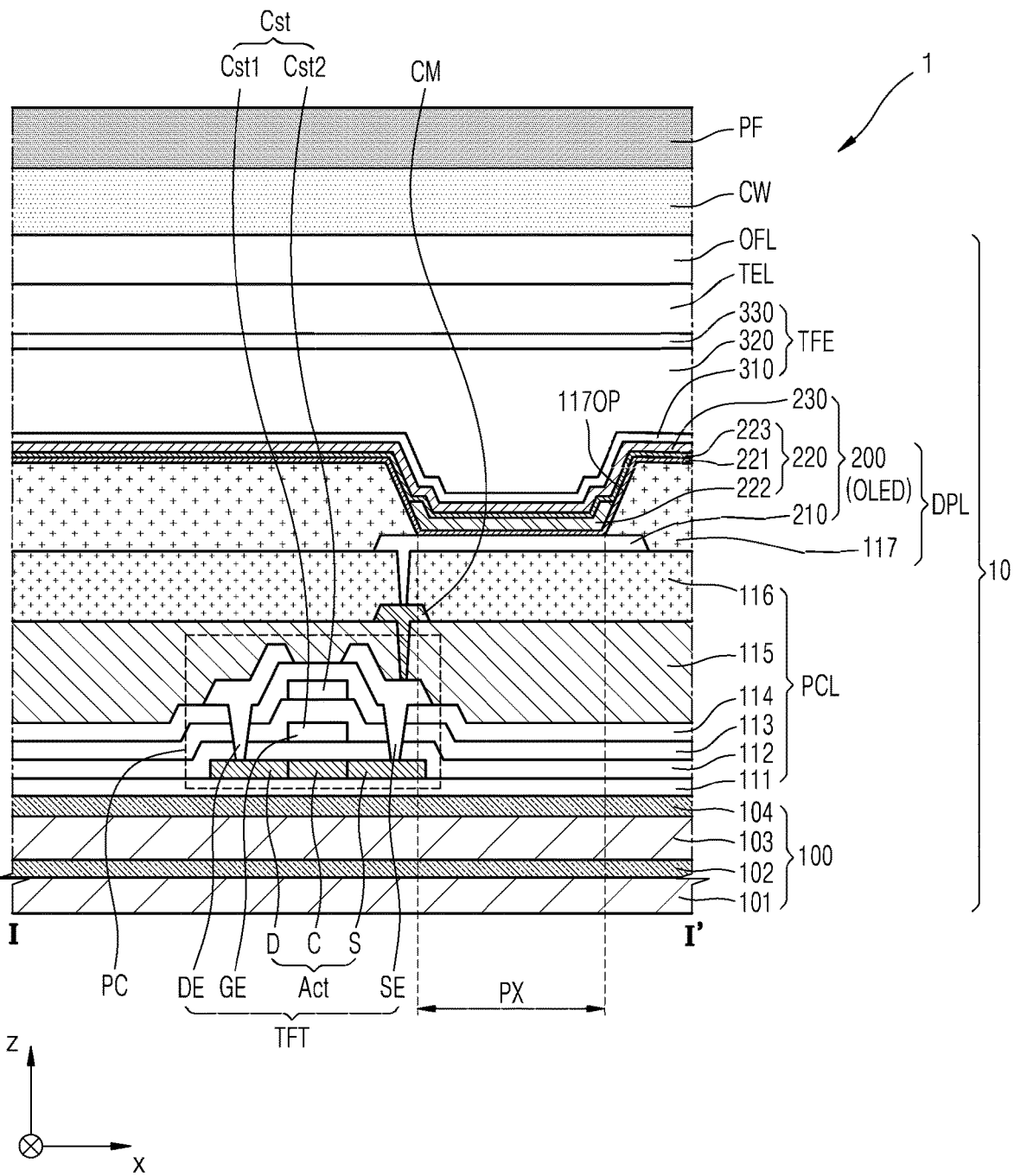
FIG. 3 is a schematic cross-sectional view of a display device taken along line I-I' of FIG. 1, according to one or more embodiments of the present disclosure.

FIG. 3 is a schematic cross-sectional view of a display device according to one or more embodiments of the present disclosure. FIG. 3 is a schematic cross-sectional view of the display device according to the one or more embodiments of FIG. 1, taken along line I-I'.

Referring to FIG. 3, the display device 1 may include the display panel 10, the cover window CW, and the protective film PF. The display panel 10 may include a stacked structure of a substrate 100, a pixel circuit layer PCL, a display layer DPL, a thin-film encapsulation layer TFE, a touch electrode layer TEL, and an optical functional layer OFL.

The substrate 100 may have a multi-layered structure including a base layer and an inorganic layer, the base layer including a polymer resin. For example, the substrate 100 may include a base layer including a polymer resin, and a barrier layer of an inorganic insulating layer. For example, the substrate 100 may include a first base layer 101, a first barrier layer 102, a second base layer 103, and a second barrier layer 104, which are sequentially stacked. The first base layer 101 and the second base layer 103 may each include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), cellulose acetate propionate (CAP), and/or the like. The first barrier layer 102 and the second barrier layer 104 may each include an inorganic insulating material, such as silicon oxide, silicon oxynitride, silicon nitride, and/or the like. The substrate 100 may be flexible.

The pixel circuit layer PCL may be disposed on the substrate 100. The pixel circuit layer PCL may include a pixel circuit PC including a thin-film transistor TFT and a storage capacitor Cst. In one or more embodiments, the pixel circuit layer PCL may include a buffer layer 111, a first gate insulating layer 112, a second gate insulating layer 113, an interlayer insulating layer 114, a first planarization interlayer insulating layer 115, and a second planarization insulating layer 116, which are disposed above and/or below the components of the pixel circuit PC.

The buffer layer 111 may reduce or block penetration of foreign substances, moisture, and/or external air from a lower portion of the substrate 100 and may provide a flat surface on the substrate 100. The buffer layer 111 may include an inorganic insulating material, such as silicon oxide, silicon oxynitride, and/or silicon nitride, and may include a single layer structure or a multi-layered structure, each including at least one of the materials stated above.

The thin-film transistor TFT disposed on the buffer layer 111 may include a semiconductor layer Act, and the semiconductor layer Act may include polysilicon. In one or more embodiments, the semiconductor layer Act may include an amorphous silicon, an oxide semiconductor, an organic semiconductor, and/or the like. The semiconductor layer Act may include a channel area C, a drain area D, and a source area S, wherein the drain area D and the source area S are respectively arranged on both sides of the channel area C. A gate electrode GE of the thin-film transistor TFT may overlap the channel area C.

The gate electrode GE may include a low-resistance metal material. The gate electrode GE may include a conductive material including molybdenum (Mo), aluminum (Al), copper (Cu), titanium (Ti), and/or the like, and may be a multi-layer or a single layer, each including at least one of the materials stated above.

The first gate insulating layer 112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

The second gate insulating layer 113 may cover the gate electrode GE. Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

An upper electrode Cst2 of the storage capacitor Cst may be disposed on the second gate insulating layer 113. The upper electrode Cst2 may overlap the gate electrode GE therebelow. At this time, the gate electrode GE and the upper electrode Cst2, which overlap each other with the second gate insulating layer 113 therebetween, may form the storage capacitor Cst. For example, the gate electrode GE may function as a lower electrode Cst1 of the storage capacitor Cst.

As such, the storage capacitor Cst and the thin-film transistor TFT may overlap each other. In one or more embodiments, the storage capacitor Cst may not overlap the thin-film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or a multi-layer, each including at least one of the materials stated above.

The interlayer insulating layer 114 may cover the upper electrode Cst2. The interlayer insulating layer 114 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like. The interlayer insulating layer 114 may include a single layer or a multi-layer, each including at least one of the inorganic insulating material stated above.

Each of a drain electrode DE and a source electrode SE of the thin-film transistor TFT may be disposed on the interlayer insulating layer 114. The drain electrode DE and the source electrode SE may be respectively connected to the drain area D and the source area S through contact holes in insulating layers below the drain electrode DE and the source electrode SE. The drain electrode DE and the source electrode SE may each include a material having good or suitable conductivity. The drain electrode DE and the source electrode SE may include a conductive material including Mo, Al, Cu, Ti, and/or the like, and may include a multi-layer or a single layer, each including at least one of the above materials. In one or more embodiments, the drain electrode DE and the source electrode SE may have a multi-layered structure of Ti/Al/Ti.

The first planarization interlayer insulating layer 115 may cover the drain electrode DE and the source electrode SE. The first planarization interlayer insulating layer 115 may include a general commercial polymer such as poly(methyl methacrylate) (PMMA) or polystyrene (PS), a polymer derivative having a phenol group, and/or an organic insulating material, such as an acrylic polymer, an imide polymer, an aryl ether polymer, an amide polymer, a fluorine polymer, a p-xylene polymer, a vinyl alcohol polymer, and/or a mixture thereof.

The second planarization insulating layer 116 may be disposed on the first planarization interlayer insulating layer 115. The second planarization insulating layer 116 may include the same material as that of the first planarization interlayer insulating layer 115, and may include a general commercial polymer, such as PMMA or PS, a polymer derivative having a phenol group, and/or an organic insulating material, such as an acrylic polymer, an imide polymer, an aryl ether polymer, an amide polymer, a fluorine polymer, a p-xylene polymer, a vinyl alcohol polymer, and/or a mixture thereof.

The display layer DPL may be disposed on the pixel circuit layer PCL having the structure described above. The display layer DPL may include an organic light-emitting diode OLED as a light-emitting element 200, and the organic light-emitting diode OLED may include a stacked structure of a pixel electrode 210, an intermediate layer 220, and an opposite electrode 230. The organic light-emitting diode OLED may be to emit, for example, red, green, or blue light, or may be to emit red, green, blue, or white light. The organic light-emitting diode OLED may be to emit light through an emission area, and may define the emission area as a pixel PX.

The pixel electrode 210 may be electrically connected to the thin-film transistor TFT through contact holes formed in the second planarization insulating layer 116 and the first planarization interlayer insulating layer 115 and a contact metal CM disposed on the first planarization interlayer insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In one or more embodiments, the pixel electrode 210 may include a reflective film including Ag, Mg, Al, Pt, Pd, Au, Ni, Nd, Ir, Cr, or a compound thereof. In one or more embodiments, the pixel electrode 210 may further include a film including ITO, IZO, ZnO, or $In_2O_3$ above and/or below the reflective film described above.

A pixel defining layer 117 having an opening 117OP exposing a central portion of the pixel electrode 210 is disposed on the pixel electrode 210. The pixel defining layer 117 may include an organic insulating material and/or an inorganic insulating material. The opening 117OP may define an emission area of light emitted from the organic light-emitting diode OLED. For example, the size/width of the opening 117OP may correspond to the size/width of the emission area. Accordingly, the size and/or width of the pixel PX may depend on the size and/or width of the opening 117OP of the pixel defining layer 117 corresponding to the pixel PX.

The intermediate layer 220 may include an emission layer 222 formed to correspond to the pixel electrode 210. The emission layer 222 may include a polymer organic material or a low-molecular-weight organic material, which emits light of a certain color. In one or more embodiments, the emission layer 222 may include an inorganic light-emitting material or a quantum dot.

A first functional layer 221 and a second functional layer 223 may be respectively disposed below and on the emission layer 222. The first functional layer 221 may include, for example, a hole transport layer (HTL), or an HTL and a hole injection layer (HIL). The second functional layer 223 is a component disposed on the emission layer 222, and may include an electron transport layer (ETL) and/or an electron injection layer (EIL). Like the opposite electrode 230 to be described in more detail below, the first functional layer 221 and/or the second functional layer 223 may be a common layer covering the entirety of the substrate 100.

The opposite electrode 230 may be disposed above the pixel electrode 210 and overlap the pixel electrode 210. The opposite electrode 230 may include a conductive material having a low work function. For example, the opposite electrode 230 may include a (semi)transparent layer (e.g., a semi-transparent or a transparent layer), the (semi)transparent layer (e.g., the semi-transparent or the transparent layer) including Ag, Mg, Al, Pt, Pd, Au, Ni, Nd, Ir, Cr, lithium (Li), Ca, alloys thereof, and/or the like. In one or more embodiments, the opposite electrode 230 may further include a layer, such as ITO, IZO, ZnO, or $In_2O_3$, above the (semi) transparent layer including at least one of the materials stated above. The opposite electrode 230 may be integrally formed to cover the entirety of the substrate 100.

The display panel 10 may include a plurality of light-emitting elements 200, and the plurality of light-emitting elements 200 may be to emit light through the pixels PX to provide an image. For example, the display area DA (see, e.g., FIG. 1) may be defined by the plurality of light-emitting elements 200. Accordingly, the display panel 10 may include the display area DA defined by the plurality of light-emitting elements 200, and the display area DA of the display panel 10 may correspond to the display area DA of the substrate 100. In other words, the front surface display area FDA, the side surface display area SDA, and the corner display area CDA of the substrate 100 may respectively be the front surface display area FDA, the side surface display area SDA, and the corner display area CDA of the display panel 10.

The thin-film encapsulation layer TFE may be disposed on the display layer DPL and cover the display layer DPL. The thin-film encapsulation layer TFE may include at least one inorganic encapsulation layer and at least one organic encapsulation layer. In one or more embodiments, FIG. 3 illustrates that the thin-film encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include at least one inorganic material of (e.g., at least one inorganic material from among) aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acrylic resin, an epoxy resin, polyimide, polyethylene, and/or the like. In one or more embodiments, the organic encapsulation layer 320 may include acrylate. The organic encapsulation layer 320 may be formed by curing a monomer or coating a polymer. The organic encapsulation layer 320 may have transparency (e.g., may be transparent).

The touch electrode layer TEL including touch electrodes may be disposed on the thin-film encapsulation layer TFE, and the optical functional layer OFL may be disposed on the touch electrode layer TEL. The touch electrode layer TEL may obtain coordinate information according to an external input, for example, a touch event. The optical functional layer OFL may reduce reflectance of light (e.g., external light) incident from the outside toward the display device 1, and/or improve color purity of light emitted from the display device 1.

An adhesive member may be between the touch electrode layer TEL and the optical functional layer OFL. As the adhesive member, a general adhesive member suitable in the related art may be employed without limitation. The adhesive member may be a pressure sensitive adhesive (PSA) or an OCA.

The cover window CW may be disposed on the display panel 10. The cover window CW may be attached on the display panel 10 by an adhesive member. The adhesive member may be a PSA or an OCA.

The protective film PF may be disposed on the cover window CW. The protective film PF may be attached on the cover window CW by an adhesive layer of the protective film PF. The components of the protective film PF are described in more detail below.

Although it has been described that the display device 1 includes the organic light-emitting diode OLED as the light-emitting element 200, the display device 1 of the present disclosure is not limited thereto. In one or more embodiments, the display device 1 may be an inorganic light-emitting display device including an inorganic light-emitting diode or an inorganic electroluminescence (EL) display device. The inorganic light-emitting display device may include a PN junction diode including materials based on inorganic semiconductors. When a voltage is applied to the PN junction diode in a forward direction, holes and electrons may be injected, and energy generated by recombination of the holes and electrons may be converted into light energy to emit a certain color of light. The inorganic light-emitting diode described above may have a width of several micrometers to several hundred micrometers, and in one or more embodiments, the inorganic light-emitting diode may be referred to as a micro light-emitting diode (LED).

Figure 4:
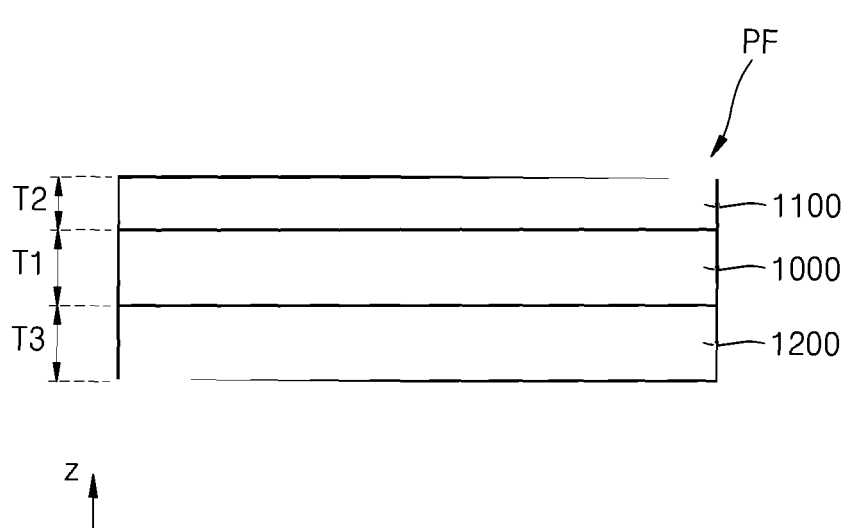
FIG. 4 is a schematic cross-sectional view of a portion of a protective film attached to a cover window, according to one or more embodiments of the present disclosure.

FIG. 4 is a schematic cross-sectional view of a portion of the protective film PF attached to the cover window CW (see, e.g., FIG. 2 and or 3).

Referring to FIG. 4, the protective film PF may include a base film layer 1000, a hard coating layer 1100 disposed on the base film layer 1000, and a urethane adhesive layer 1200 disposed below the base film layer 1000.

The base film layer 1000 may be between the hard coating layer 1100 and the urethane adhesive layer 1200. The base film layer 1000 may protect the hard coating layer 1100 while supporting the protective film PF.

For example, a thickness T1 of the base film layer 1000 may be in a range of about 15 μm to about 100 μm. In one or more embodiments, the thickness T1 of the base film layer 1000 may range from, for example, about 18 μm to about 70 μm. In one or more embodiments, the thickness T1 of the base film layer 1000 may range from, for example, about 20 μm to about 50 μm. When the thickness T1 of the base film layer 1000 is less than 15 μm, it may be difficult to support the protective film PF or protect the hard coating layer 1100. When the thickness T1 of the base film layer 1000 is greater than 100 μm, adhesion to a bent area of a cover window CW may be reduced. For example, the thickness T1 of the base film layer 1000 may be 25 μm. When the thickness T1 of the base film layer 1000 is 25 μm, a defect occurrence rate in a process of attaching the protective film PF to the cover window CW (see, e.g., FIGS. 2 and/or 3) is reduced as compared with a case in which the thickness T1 of the base film layer 1000 is less than 25 μm, and the base film layer 1000 having the thickness T1 of 25 μm may be prevented or substantially prevented from being easily detached from the bent area of the cover window CW as compared with a case in which the thickness T1 of the base film layer 1000 is greater than 25 μm.

The base film layer 1000 may include a synthetic resin material film. The base film layer 1000 may include a synthetic resin material film having fluidity. The base film layer 1000 may include a rigid synthetic resin material film. For example, the base film layer 1000 may include at least one of polyethylene terephthalate (PET), polypropylene (PP), non-stretched PP (CPP), polyurethane (PU), and/or polyolefin (PO).

The hard coating layer 1100 may be disposed on the base film layer 1000. The hard coating layer 1100 may be spaced apart from the urethane adhesive layer 1200 with the base film layer 1000 therebetween.

A thickness T2 of the hard coating layer 1100 may be less than the thickness T1 of the base film layer 1000. For example, the thickness T2 of the hard coating layer 1100 may be in a range of about 1 μm to about 10 μm. The thickness T2 of the hard coating layer 1100 may range from, for example, about 1.2 μm to about 10 μm. The thickness T2 of the hard coating layer 1100 may range from, for example, about 1.5 μm to about 5 μm. When the thickness T2 of the hard coating layer 1100 is greater than 10 μm, excessive curling of the protective film PF may occur, and when the thickness T2 is less than 1 μm, scratch resistance of the protective film PF may be excessively reduced.

As the thickness T1 of the base film layer 1000 is formed to be relatively thin, for example, less than 100 μm, or less than 50 μm, excessive curling of the protective film PF may occur when the thickness T2 of the hard coating layer 1100 is greater than the above ranges.

The hard coating layer 1100 may include an ultraviolet (UV) curable material. The hard coating layer 1100 may include a UV curable composition. The UV curable composition may be referred to as a hard coating composition. The hard coating layer 1100 may include a fluorine-based photocurable resin, a urethane photocurable resin, a glycol-based photocurable resin, a propane-based photocurable resin, and a photoinitiator. The UV curable composition of the hard coating layer 1100 may include a fluorine-based photocurable resin, a urethane photocurable resin, a glycol-based photocurable resin, a propane-based photocurable resin, a photoinitiator, and a solvent.

In one or more embodiments, to prevent or substantially prevent reduction of scratch resistance due to the hard coating layer 1100 being formed to a relatively thin thickness ranging from, for example, about 1 μm to about 10 μm, the hard coating layer 1100 may include a fluorine-based photocurable resin. For example, the fluorine-based photocurable resin of the hard coating layer 1100 may improve scratch resistance of the protective film PF. As described with reference to Tables 1 and 2, when the hard coating layer 1100 is formed by including about 3 wt % or more of a fluorine-based photocurable resin, scratch resistance, contamination resistance, and abrasion resistance of the protective film PF may be improved.

In one or more embodiments, the hard coating layer 1100 may include a glycol-based photocurable resin to prevent or reduce curling of the protective film PF. As described with reference to Tables 3 and 4, when the hard coating layer 1100 is formed by including the glycol-based photocurable resin, the occurrence of curling of the protective film PF may be reduced.

For example, the fluorine-based photocurable resin may include at least one of perfluoropolyether(PFPE)-tetraurethane acrylate, 1 H,1 H,5H-octafluoropentyl methacrylate, 1H,1H,2H,2H-nonafluorohexyl acrylate, pentafluorophenyl acrylate, 2,3,3-tetrafluoropropyl acrylate, and/or 2,2,3,4,4,4-hexafluorobutyl acrylate.

The glycol-based photocurable resin may include, for example, a chain extender having a bifunctional group. The chain extender having a bifunctional group may prevent or substantially prevent the occurrence of curling of the protective film PF by lowering the crosslinking density of hard coating layer 1100. The glycol-based photocurable resin may include, for example, a chain extender having a bifunctional group having a high glass transition temperature (Tg). When the glycol-based photocurable resin includes a chain extender having a bifunctional group having a high Tg, reduction of scratch resistance of the protective film PF may be prevented or substantially prevented. The glycol-based photocurable resin may include, for example, hydroxy pivalic acid neopentyl glycol diacrylate.

The urethane photocurable resin may include, for example, at least one of urethane acrylate, urethane metacrylate, polyester urethane acrylate, and/or epoxy acrylate.

The propane-based photocurable resin may be, for example, trimethylol propane triacrylate.

The solvent of the UV curable composition may be, for example, 1-methoxy-2-propanol (PM), toluene, xylene, methyl ethyl ketone, ethyl acetate, or buthyl acetate.

The photoinitiator may include, for example, at least one of benzil dimethyl ketal, hydroxycyclohexyl phenyl ketone, phenylbis(2,4,6-trimethylbenzoyl)phosphineoxide, and/or a blend of oxy-phenyl-acetic acid 2-[2-oxo-2-phenyl-acetoxy-ethoxy]-ethyl ester and oxy-phenyl-acetic acid 2-[2-hydroxyethoxy]-ethyl ester.

In the UV curable composition of the hard coating layer 1100, the weight ratio of the fluorine-based photocurable resin may be in a range of about 3 wt % to about 10 wt %, the weight ratio of the glycol-based photocurable resin may be in a range of about 1 wt % to about 8 wt %, the weight ratio of the urethane photocurable resin may be in a range of about 10 wt % to about 50 wt %, the weight ratio of the propane-based photocurable resin may be in a range of about 1 wt % to about 15 wt %, the weight ratio of the solvent may be in a range of about 30 wt % to about 80 wt %, and the weight ratio of the photoinitiator may be in a range of about 0.5 wt % to about 10 wt %, based on a total weight of the hard coating layer 1100. When the fluorine-based photocurable resin has a weight ratio in a range of about 3 wt % to about 10 wt %, and the glycol-based photocurable resin has a weight ratio in a range of about 1 wt % to about 8 wt %, scratch resistance of the protective film PF may be improved, and the occurrence of curling of the protective film PF may be concurrently (e.g., simultaneously) prevented or reduced.

The urethane adhesive layer 1200 may be disposed below the base film layer 1000. The urethane adhesive layer 1200 may be between the base film layer 1000 and the cover window CW (see, e.g., FIGS. 2 and 3). The protective film PF may be attached on the cover window CW by the urethane adhesive layer 1200.

For example, a thickness T3 of the urethane adhesive layer 1200 may be in a range of about 5 μm to about 40 μm. The thickness T3 of the urethane adhesive layer 1200 may range from, for example, about 5 μm to about 35 μm. In one or more embodiments, the thickness T3 of the urethane adhesive layer 1200 may range from, for example, about 10 μm to about 30 μm.

The urethane adhesive layer 1200 may include a urethane adhesive resin. The urethane adhesive layer 1200 may include a urethane adhesive composition including a urethane adhesive resin and a urethane adhesive curing agent. To improve the optical characteristics represented by T.T/Haze of the urethane adhesive layer 1200, the surface roughness (smoothness) of the urethane adhesive layer 1200 should be excellent or suitable, and the compatibility of the urethane adhesive resin and the urethane adhesive curing agent should be excellent or suitable. The surface roughness of the urethane adhesive layer 1200 may be improved when the urethane adhesive layer 1200 has a fast curing speed. The compatibility of the urethane adhesive resin and the urethane adhesive curing agent and/or the like may be improved by the polarity and molecular weight of the urethane adhesive resin.

The urethane adhesive resin may include polyol, hexamethylene diisocyanate (HDI), a catalyst, and a solvent. The polyol of the urethane adhesive resin may be polypropylene glycol (PPG). The weight ratio of the PPG of the urethane adhesive resin may be in a range of about 1.5 wt % to 65 wt %, the weight ratio of the HDI may be in a range of about 10 wt % to about 30 wt %, and the weight ratio of the solvent may be in a range of about 20 wt % to about 70 wt %, based on a total weight of the urethane adhesive resin. For example, the PPG may include at least one of PPG-1000 having a molecular weight of 1000 and a functional group of 2, PPG-400 having a molecular weight of 400 and a functional group of 2, and/or HD-402 having a molecular weight of 402 and a functional group of 4.

The urethane adhesive resin may include a polyol having a molecular weight in a range of about 400 to about 1000. The urethane adhesive resin may include PPG having a molecular weight in a range of about 400 to about 1000. For example, the urethane adhesive resin may include at least one of PPG-1000 having a molecular weight of 1000 and a functional group of 2, PPG-400 having a molecular weight of 400 and a functional group of 2, and/or HD-402 having a molecular weight of 402 and a functional group of 4. When a polyol having a molecular weight of more than 1000 is included, the compatibility of the urethane adhesive resin and the urethane adhesive curing agent and/or the like may be reduced, as described with reference to Tables 5 and 6.

The urethane adhesive resin may include a polyol having 4 functional groups. For example, the urethane adhesive resin may include HD-402 having 4 functional groups. In the case of including a polyol having 4 functional groups, as described with reference to Table 8, it can be confirmed that the initial curing speed of the urethane adhesive layer 1200 is fast and the initial adhesive force thereof is relatively low. As a result, it can be confirmed that the optical characteristics represented by T.T/Haze is improved.

The catalyst forming the urethane adhesive resin may be dibutyltin dilaurate (DBTDL), stannous octoate, or potassium acetate. The solvent utilized to form the urethane adhesive resin may be PM, toluene, xylene, or ethyl acetate.

The urethane adhesive curing agent may be at least one of an aliphatic polyisocyanate derived from hexamethylene diisocyanate (HDI) (e.g., CORONATE® and DURANATE®24A-100). an aliphatic polyisocyanate derived from isophorone diisocyanate (IPDI) (e.g., DESMODUR® Z 4470), or an aromatic polyisocyanate derived from toluene diisocyanate (TDI) (e.g., KONNATE® L-75).

According to one or more embodiments, the total transmittance of the protective film PF including the base film layer 1000, the hard coating layer 1100, and the urethane adhesive layer 1200 may range, for example, from about 90% to about 100%. The total transmittance of the protective film PF may range, for example, from about 90.5% to about 100%. The total transmittance of the protective film PF may range, for example, from about 90.8% to about 100%.

According to one or more embodiments, the haze of the protective film PF including the base film layer 1000, the hard coating layer 1100, and the urethane adhesive layer 1200 may range, for example, from about 0.4% to about 1.2%. The haze of the protective film PF may range, for example, from about 0.45% to about 1.15%. The haze of the protective film PF may range, for example, from about 0.5% to about 1.1%.

According to one or more embodiments, the initial adhesive force of the protective film PF including the base film layer 1000, the hard coating layer 1100, and the urethane adhesive layer 1200 may range, for example, from about 300 gf/in to about 1200 gf/in. The adhesive force of the protective film PF may range, for example, from about 350 gf/in to about 1150 gf/in. The adhesive force of the protective film PF may range, for example, from about 400 gf/in to about 1100 gf/in. The lower the initial adhesive force of the protective film PF, the greater the hardness thereof. In this case, scratch resistance of the protective film PF may be improved.

According to one or more embodiments, an adhesive force after aging the protective film PF including the base film layer 1000, the hard coating layer 1100, and the urethane adhesive layer 1200 at 60° C. for 3 days may range, for example, from about 200 gf/in to about 1900 gf/in. The adhesive force after aging the protective film PF at 60° C. for 3 days may range, for example, from about 250 gf/in to about 950 gf/in. The adhesive force after aging the protective film PF at 60° C. for 3 days may range, for example, from about 300 gf/in to about 900 gf/in. An adhesive force after aging the protective film PF may be an adhesive force when attaching the protective film PF to an object to be attached.

Figure 5:
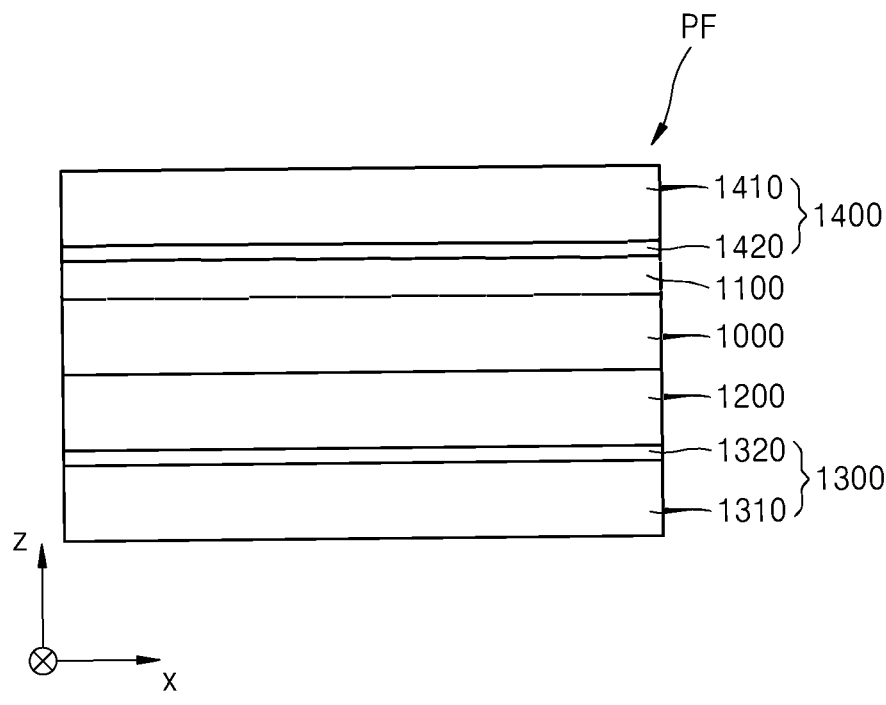
FIG. 5 is a schematic cross-sectional view of a portion of a protective film before being attached to a cover window, according to one or more embodiments of the present disclosure.

FIG. 5 is a schematic cross-sectional view of a portion of the protective film PF before being attached to the cover window CW (see, e.g., FIGS. 2 and 3). In FIG. 5, descriptions of the same components described by the same reference numerals in FIG. 4 may be omitted for convenience, and additional components are described.

Referring to FIG. 5, the protective film PF may include the base film layer 1000, the hard coating layer 1100, the urethane adhesive layer 1200, a lower exfoliation layer 1300, and an upper exfoliation layer 1400.

The lower exfoliation layer 1300 may be disposed below the urethane adhesive layer 1200. The lower exfoliation layer 1300 may protect the protective film PF. The lower exfoliation layer 1300 may be a layer protecting the urethane adhesive layer 1200. The lower exfoliation layer 1300 may be removed when attaching the protective film PF to the cover window CW (refer to FIG. 2). For example, the protective film PF may be attached on the cover window CW by the urethane adhesive layer 1200 exposed after the lower exfoliation layer 1300 is removed.

The lower exfoliation layer 1300 may include a first synthetic resin material film layer 1310 and a release coating layer 1320 coated on the first synthetic resin material film layer 1310. In one or more embodiments, the lower exfoliation layer 1300 may be an off-line PET liner formed by buying a synthetic resin material film and separately release-coating the synthetic resin material film, rather than a commercially available in-line PET liner, which is a finished product that is release-coated on a synthetic resin material film and sold.

The lower exfoliation layer 1300 may include a synthetic resin material film having fluidity. The lower exfoliation layer 1300 may include a rigid synthetic resin material film. For example, the first synthetic resin material film layer 1310 may be a rigid synthetic resin material film having fluidity. For example, the first synthetic resin material film layer 1310 may include at least one of PET, PP, CPP, PU, and/or PO.

The release coating layer 1320 may be between the first synthetic resin material film layer 1310 and the urethane adhesive layer 1200. The release coating layer 1320 may be a layer that facilitates release of the lower exfoliation layer 1300 from the urethane adhesive layer 1200. The release coating layer 1320 may be a silicone release coating layer including a silicone release agent. The thickness of the release coating layer 1320 may be in a range of about 0.4 μm to about 0.8 μm. As described with reference to Table 10, it can be confirmed that the optical characteristics of the protective film PF are improved when the thickness of the release coating layer 1320 is formed within the above range.

The upper exfoliation layer 1400 may be disposed on the hard coating layer 1100. The upper exfoliation layer 1400 may be spaced apart from the base film layer 1000 with the hard coating layer 1100 therebetween. The upper exfoliation layer 1400 may protect the protective film PF. The upper exfoliation layer 1400 may be a layer protecting the hard coating layer 1100. The upper exfoliation layer 1400 may be removed when attaching the protective film PF to the cover window CW (see, e.g., FIGS. 2 and 3).

The upper exfoliation layer 1400 may include a second synthetic resin material film layer 1410 and a silicone adhesive layer 1420 coated on the second synthetic resin material film layer 1410.

The upper exfoliation layer 1400 may include a synthetic resin material film having fluidity. The upper exfoliation layer 1400 may include a rigid synthetic resin material film. For example, the second synthetic resin material film layer 1410 may be a rigid synthetic resin material film having fluidity. For example, the second synthetic resin material film layer 1410 of the upper exfoliation layer 1400 may include at least one of PET, PP, CCP, PU, and/or PO.

The silicone adhesive layer 1420 may include a silicone adhesive. The silicone adhesive layer 1420 is a layer that allows the upper exfoliation layer 1400 to be adhered to the hard coating layer 1100, and must be removed during use, so the adhesive force of the silicone adhesive layer 1420 may be in a range of about 1 gf/inch to about 2 gf/inch.

Method of Manufacturing a Protective Film

Hereinafter, a method of manufacturing the protective film PF described with reference to FIGS. 4 and 5 is described.

The method of manufacturing the protective film PF may include preparing the base film layer 1000, forming the hard coating layer 1100 including the fluorine-based photocurable resin on the base film layer 1000, and forming urethane adhesive layer 1200 below the base film layer 1000. In one or more embodiments, the method of manufacturing the protective film PF may further include forming the lower exfoliation layer 1300 below the urethane adhesive layer 1200, and forming the upper exfoliation layer 1400 on the hard coating layer 1100.

First, the base film layer 1000 including a synthetic resin material film may be prepared. The base film layer 1000 may include a synthetic resin material film having fluidity. The base film layer 1000 may include a rigid synthetic resin material film. For example, the base film layer 1000 may be formed to include at least one of PET, PP, CPP, PU, and/or PO.

For example, the thickness T1 of the base film layer 1000 may be formed in a range of about 15 μm to about 100 μm. In one or more embodiments, the thickness T1 of the base film layer 1000 may be formed to range from, for example, about 18 μm to about 70 μm. In one or more embodiments, the thickness T1 of the base film layer 1000 may be formed to range from, for example, about 20 μm to about 50 μm.

Next, the hard coating layer 1100 may be formed on the base film layer 1000. The hard coating layer 1100 may be formed by first preparing a hard coating composition, then coating the hard coating composition on the base film layer 1000, and then UV-curing the coated hard coating composition.

The hard coating composition may be prepared by utilizing a fluorine-based photocurable resin, a glycol-based photocurable resin, a urethane photocurable resin, a propane-based photocurable resin, a solvent, and a photoinitiator.

The hard coating composition may be manufactured by utilizing a fluorine-based photocurable in a range of about 3 wt % to about 10 wt %, a glycol-based photocurable resin in a range of about 1 wt % to about 8 wt %, a urethane photocurable resin in a range of about 10 wt % to about 50 wt %, a propane-based photocurable resin in a range of about 1 wt % to about 15 wt %, a solvent in a range of about 30 wt % to about 80 wt %, and a photoinitiator in a range of about 0.5 wt % to about 10 wt %.

For example, the fluorine-based photocurable resin may include at least one of perfluoropolyether(PFPE)-tetraurethane acrylate, 1 H,1 H,5H-octafluoropentyl methacrylate, 1H,1H,2H,2H-nonafluorohexyl acrylate, pentafluorophenyl acrylate, 2,3,3-tetrafluoropropyl acrylate, and/or 2,2,3,4,4,4-hexafluorobutyl acrylate.

The glycol-based photocurable resin may include, for example, a chain extender having a bifunctional group. The chain extender having a bifunctional group may prevent or substantially prevent the occurrence of curling of the protective film PF by lowering the crosslinking density of the hard coating layer 1100. The glycol-based photocurable resin may include, for example, a chain extender having a bifunctional group having a high glass transition temperature (Tg).

The urethane photocurable resin may include, for example, at least one of urethane acrylate, urethane metacrylate, polyester urethane acrylate, and/or epoxy acrylate. The propane-based photocurable resin may be, for example, trimethylol propane triacrylate. The solvent of the hard coating composition may be, for example, PM, toluene, xylene, methyl ethyl ketone, ethyl acetate, or buthyl acetate. The photoinitiator may include, for example, at least one of benzil dimethyl ketal, hydroxycyclohexyl phenyl ketone, phenylbis(2,4,6-trimethylbenzoyl)phosphineoxide, and/or a blend of oxy-phenyl-acetic acid 2-[2-oxo-2-phenyl-acetoxy-ethoxy]-ethyl ester and oxy-phenyl-acetic acid 2-[2-hydroxyethoxy]-ethyl ester.

A process of forming the hard coating layer 1100 may further include drying the prepared hard coating composition before coating the prepared hard coating composition on the base film layer 1000.

The coating of the prepared hard coating composition on the base film layer 1000 may be, for example, a process utilizing a micro gravure coater. A coating method utilizing the micro gravure coater is a precise coating method in which a UV curable hard coating composition is uniformly coated as a thin film having a micro thickness by minimizing or reducing the radius of a coating roll of the micro gravure coater to minimize or reduce the roll surface (of the coating roll) and thus minimizing or reducing the amount (range) of the applied UV curable hard coating composition.

The prepared hard coating composition may be coated on the base film layer 1000 at a thickness less than the thickness of the base film layer 1000. For example, the thickness of the coated hard coating composition may be in a range of about 1 μm to about 10 μm. For example, the thickness of the coated hard coating composition may be in a range of about 1.2 μm to about 10 μm. For example, the thickness of the coated hard coating composition may be in a range of about 1.5 μm to about 5 μm.

The hard coating layer 1100 may be formed by UV-photocuring the hard coating composition coated on the base film layer 1000. The UV-photocuring of the hard coating composition may be performed, for example, at a temperature of about 30° C. to about 100° C. and at a UV lamp intensity of about 200 mJ to about 3000 mJ. The UV-photocuring of the hard coating composition may be performed, for example, at a temperature of about 40° C. to about 90° C., or at a temperature of about 50° C. to about 80° C. In the UV-photocuring of the hard coating composition, the intensity of a UV lamp may range, for example, from about 300 mJ to about 2000 mJ, or from about 500mJ to about 1500 mJ.

Next, the urethane adhesive layer 1200 may be formed below the base film layer 1000. The urethane adhesive layer 1200 may be formed by first preparing a urethane adhesive composition, then coating the urethane adhesive composition on a lower portion of the base film layer 1000, and then thermally curing the coated urethane adhesive composition.

The urethane adhesive composition may include a urethane adhesive resin and a urethane adhesive curing agent.

The urethane adhesive resin may include polyol, HDI, a catalyst, and a solvent. The polyol of the urethane adhesive resin may be PPG. The weight ratio of the PPG of the urethane adhesive resin may be in a range of about 1.5 wt % to about 65 wt %, the weight ratio of the HDI may be in a range of about 10 wt % to about 30 wt %, and the weight ratio of the solvent may be in a range of about 20 wt % to about 70 wt %, based on a total weight of the urethane adhesive resin. For example, the PPG may include at least one of PPG-1000 having a molecular weight of 1000 and a functional group of 2, PPG-400 having a molecular weight of 400 and a functional group of 2, and/or HD-402 having a molecular weight of 402 and a functional group of 4. The urethane adhesive resin may include a polyol having a molecular weight in a range of about 400 to about 1000. The urethane adhesive resin may include PPG having a molecular weight in a range of about 400 to about 1000. For example, the urethane adhesive resin may include at least one of PPG-1000 having a molecular weight of 1000 and a functional group of 2, PPG-400 having a molecular weight of 400 and a functional group of 2, and/or HD-402 having a molecular weight of 402 and a functional group of 4.

The catalyst forming the urethane adhesive resin may be DBTDL, stannous octoate, or potassium acetate. The solvent utilized to form the urethane adhesive resin may be PM, toluene, xylene, or ethyl acetate.

The urethane adhesive curing agent may be at least one of an aliphatic polyisocyanate derived from hexamethylene diisocyanate (HDI) (e.g., CORONATE® and DURANATE® 24A-100). an aliphatic polyisocyanate derived from isophorone diisocyanate (IPDI) (e.g., DESMODUR® Z 4470), or an aromatic polyisocyanate derived from toluene diisocyanate (TDI) (e.g., KONNATE® L-75).

The prepared urethane adhesive composition in a solution state may be coated on the lower portion of the base film layer 1000. The urethane adhesive composition may be coated on a second surface of the base film layer 1000, wherein the second surface is opposite to a first surface of the base film layer 1000, and the hard coating layer 1100 is disposed on the first surface. The coating of the urethane adhesive composition may be, for example, a process utilizing a slot die coater. A coating method utilizing the slot die coater is a method of coating by supplying a urethane adhesive composition in a liquid state between nozzle-shaped metal plates by utilizing a pump.

The urethane adhesive layer 1200 may be formed by thermally curing the urethane adhesive composition. The urethane adhesive composition in a solution state may be dried by a thermal curing process to remove the solvent included in the urethane adhesive composition. The urethane adhesive composition from which the solvent is removed may be cured by reacting the urethane adhesive resin and the urethane adhesive curing agent.

The forming of the urethane adhesive layer 1200 by thermally curing the urethane adhesive composition may be performed at about 60° C. to about 140° C. In one or more embodiments, the forming of the urethane adhesive layer 1200 by thermally curing the urethane adhesive composition may be performed at about 70° C. to about 140° C., or at about 80° C. to about 140° C. The highest temperature of the thermal curing process for forming the urethane adhesive layer 1200 may be 140° C. For example, the process of thermally curing the urethane adhesive composition may be performed in a stepwise temperature cycle having a sequence, such as by cycling through each of the following temperatures in order: 80° C.-100° C.-130° C.-140° C.-130° C.-80° C.

The lower exfoliation layer 1300 may be formed to be disposed below the urethane adhesive layer 1200. The forming of the lower exfoliation layer 1300 may include preparing the first synthetic resin material film layer 1310 and forming the release coating layer 1320 on the first synthetic resin material film layer 1310.

The first synthetic resin material film layer 1310 may be a rigid synthetic resin material film having fluidity. For example, the first synthetic resin material film layer 1310 may include at least one of PET, PP, CPP, PU, and/or PO.

The release coating layer 1320 may include a silicone release agent. The release coating layer 1320 may be formed by coating a silicone release agent on the first synthetic resin material film layer 1310. The coating of the release coating layer 1320 may be, for example, a coating process utilizing a slot die coater. The thickness of the release coating layer 1320 may be formed in a range of about 0.4 μm to about 0.8 μm.

The forming of the release coating layer 1320 may include a process of thermally curing the coated silicone release agent at about 60° C. to about 140° C. The thermally curing of the coated silicone release agent may be performed at about 70° C. to about 140° C., or at about 80° C. to about 140° C. For example, the thermally curing of the coated silicone release agent may have a stepwise temperature cycle, such as by cycling through each of the following temperatures in order: 80° C.-100° C.-130° C.-140° C.-130° C.-80° C.

The lower exfoliation layer 1300 may be disposed on the urethane adhesive layer 1200 such that the release coating layer 1320 is between the first synthetic resin material film layer 1310 and the urethane adhesive layer 1200.

The upper exfoliation layer 1400 may be formed to be disposed on the hard coating layer 1100. The forming of the upper exfoliation layer 1400 may including preparing the second synthetic resin material film layer 1410 and forming the silicone adhesive layer 1420 on the second synthetic resin material film layer 1410.

The second synthetic resin material film layer 1410 may be a rigid synthetic resin material film having rigidity. For example, the second synthetic resin material film layer 1410 may include at least one of PET, PP, CPP, PU, and/or PO.

The silicone adhesive layer 1420 may include a silicone adhesive. The silicone adhesive layer 1420 may be formed by coating a silicone adhesive on the second synthetic resin material film layer 1410. The process of forming the release coating layer 1320 may be, for example, a coating process utilizing a slot die coater. The coating of the silicone release agent on the second synthetic resin material film layer 1410 may be, for example, a coating process utilizing a slot die coater. The adhesive force of the silicone adhesive layer 1420 may be formed to be in a range of about 1 gf/inch to about 2 gf/inch.

Examples and Comparative Example According to the Content (e.g., Amount) of a Fluorine-Based Photocurable Resin of a Hard Coating Layer

TABLE 1

| Components | Comparative Example | Example A1 | Example A2 | Example A3 |
|---|---|---|---|---|
| I-754 | 3 | 3 | 3 | 3 |
| PM | 61.1 | 59.1 | 57.1 | 55.1 |
| UA-32P | 20.9 | 20.9 | 20.9 | 20.9 |
| UA-100H | 11 | 11 | 11 | 11 |
| M300 | 3 | 3 | 3 | 3 |
| AD1700 | 1 | 3 | 5 | 7 |
| Total (g) | 100 | 100 | 100 | 100 |

I-754: Blend of oxy-phenyl-acetic acid 2-[2-oxo-2-phe-nyl-acetoxyethoxy]-ethyl ester and oxy-phenyl-acetic acid 2-[2-hydroxyethoxy]-ethyl ester
PM: 1-methoxy-2-propanol
UA-32P: Urethane acrylate oligomer
UA-100H: Urethane acrylate oligomer
M300: Trimethylol propane triacrylate
AD1700: Perfluoropolyether(PFPE)-tetraurethane acry-late

TABLE 2

| Physical properties | Comparative Example A0 | Example A1 | Example A2 | Example A3 |
|---|---|---|---|---|
| Scratches after abrasion | Yes | No | No | No |
| Contact angle (°) ($H_2O$) | 98 | 110 | 115 | 115 |

Table 1 shows Comparative Example and Examples of hard coating compositions formed by utilizing fluorine-based photocurable resins (AD1700) having different contents. Table 1 shows a content (e.g., amount) of each of a fluorine-based photocurable resin (AD1700), a urethane photocurable resin (UA-32P, UA-100H), a propane-based photocurable resin (M300), a solvent (PM), and a photoini-tiator (I-754), which form each of the hard coating compositions.

Table 2 shows the results of measuring the physical properties of protective films formed by respective hard coating compositions of Table 1. Table 2 shows the physical properties of protective films manufactured by micro-gra-vure coating the hard coating compositions of Table 1 on a base film having a thickness of 25 μm to form a hard coating layer having a thickness of 2 μm, aging the hard coating layer at 60° C. for 3 days, and then UV-curing the hard coating layer.

A scratch resistance measurement test in Table 2 was measured by reciprocating 500 times on a coated film surface on which a coating agent is coated by utilizing an abrasion tester (model name: TO-550) equipped with steel wool Grade 0000 (Liberon) with a load of 500 g.

In a contact angle measurement test (antifouling evalua-tion) of Table 2, after fixing the coated film and $H_2O$ syringe needle at a height of 3 cm and dropping one droplet of $H_2O$, recording an average value of left and right contact angles, and then measuring 5 times in substantially the same method to obtain and measure an average by utilizing a contact angle measurement device (model name: Phoenix 300).

Referring to Tables 1 and 2, it can be confirmed that scratches occurred in the case of Comparative Example A0 in which the content (e.g., amount) of AD1700, which is a fluorine-based photocurable resin, is 1 wt % or less. It can be confirmed that scratches did not occur in the case of Examples A1, A2, and A3, in which the content (e.g., amount) of AD1700, which is a fluorine-based photocurable resin, is 3 wt % or more. Also, as a contact angle increases, stain resistance and abrasion resistance may be improved. When the content (e.g., amount) of AD1700 is increased from 1 wt % to 5 wt %, it can be confirmed that the stain resistance and abrasion resistance were gradually improved. However, it can be confirmed that the degree of improvement in physical properties for stain resistance and wear resistance was not large when the content (e.g., amount) of AD1700 was 5 wt % or more.

Examples and Comparative Example According to the Content (e.g., Amount) of a Glycol-Based Photocurable Resin of a Hard Coating Layer

TABLE 3

| Components | Comparative Example B0 | Example B1 | Example B2 | Example B3 |
|---|---|---|---|---|
| CP-4 | 3 | 3 | 3 | 3 |
| PM | 59.1 | 56.1 | 53.1 | 50.1 |
| UA-32P | 20.9 | 20.9 | 20.9 | 20.9 |
| UA-100H | 11 | 11 | 11 | 11 |
| M300 | 3 | 3 | 3 | 3 |
| M210 | — | 3 | 6 | 9 |
| AD1700 | 3 | 3 | 3 | 3 |
| Total (g) | 100 | 100 | 100 | 100 |

CP-4: 1-hydroxycyclohexyl-phenyl ketone
PM: 1-methoxy-2-propanol
UA-32P: Urethane acrylate oligomer
UA-100H: Urethane acrylate oligomer
M300: Trimethylol propane triacrylate
M210: Hydroxy pivalic acid neopentyl glycol Diacrylate
AD1700: Perfluoropolyether(PFPE)-tetraurethane acrylate

TABLE 4

| Physical properties | Comparative Example B0 | Example B1 | Example B2 | Example B3 |
|---|---|---|---|---|
| Scratches after abrasion | No | No | No | Yes |
| Curl (mm) when forming a 3 μm hard coating layer | 3 | 1 | 0 | 0 |

Table 3 shows Comparative Example B0 of a hard coating composition not including M210, which is a glycol-based photocurable resin, and Examples B1, B2, and B3 of hard coating compositions each including M210. Table 3 shows a content (e.g., amount) of each of the fluorine-based photocurable (AD1700), the urethane photocurable resin (UA-32P, UA-100H), the glycol-based photocurable resin (M210), the propane-based photocurable resin (M300), the solvent (PM), and the photoinitiator (CP-4), which form each of the hard coating compositions.

Table 4 shows the results of measuring the physical properties of protective films formed by respective hard coating compositions of Table 3. Table 4 shows the physical properties of protective films manufactured by micro-gravure coating the hard coating compositions of Table 3 on a base film having a thickness of 25 μm to form a hard coating layer having a thickness of 3 μm, aging the hard coating layer at 60° C. for 3 days, and then UV-curing the hard coating layer.

A scratch resistance measurement test in Table 4 was measured by reciprocating 500 times on a coated film surface on which a coating agent is coated by utilizing an abrasion tester (model name: TO-550) equipped with steel wool Grade 0000 (Liberon) with a load of 500 g.

In a curl measurement test of Table 4, the protective film according to each of Comparative Example and Examples was cut to 10 cm×10 cm, and then a distance between each of four edges of the cut protective film and the bottom was measured, an average value of each of Comparative Example and Examples was obtained, and the average values were compared with each other.

Referring to Tables 3 and 4, it can be confirmed that Examples B1, B2, and B3, each of which includes M210, which is a glycol-based photocurable resin, had reduced curling compared to Comparative Example B0 without M210. It can be confirmed that the occurrence of curl decreased as the content (e.g., amount) of M210 increased. When the content (e.g., amount) of M210 was 6 wt % or more, it was difficult to confirm curl generation regardless of the content (e.g., amount) of M210, so it can be confirmed that the degree of physical property improvement was not large.

Example and Comparative Examples According to the Type or Kind of Polyol Configuring a Urethane Adhesive Resin

TABLE 5

| Components | Example C1 | Comparative Example C2 | Comparative Example C3 | Comparative Example C4 |
|---|---|---|---|---|
| PP-1000 | 14.5 | — | — | — |
| PP-400 | 33.2 | 33.2 | 33.2 | 33.2 |
| HD-402 | 1.8 | 1.8 | 1.8 | 1.8 |
| PP-2000 | — | 14.5 | — | — |
| PP-3000 | — | — | 14.5 | — |
| PP-4000 | — | — | — | 14.5 |
| DBTDL | 0.5 | 0.5 | 0.5 | 0.5 |
| HDI | 16.2 | 16.2 | 16.2 | 16.2 |
| Toluene | 33.8 | 33.8 | 33.8 | 33.8 |
| Total (g) | 100 | 100 | 100 | 100 |

TABLE 6

| Urethane adhesive curing agent | Urethane adhesive resin | | | |
|---|---|---|---|---|
| | Example C1 | Comparative Example C2 | Comparative Example C3 | Comparative Example C4 |
| CORNATE HX | ○ | X | X | X |
| DESMODUR Z 4470 | ○ | X | X | X |
| KONNATE L-75 | ○ | X | X | X |
| DURANATE 24A-100 | ○ | X | X | X |

Table 5 shows Examples and Comparative Examples of urethane adhesive resins according to the types (kinds) of polyols included. Table 5 shows a content (e.g., amount) of each of polyol, HDI, a catalyst, and a solvent, which form a urethane adhesive resin. Example C1 utilized PPG-1000 with a molecular weight of 1000, to form a urethane adhesive resin, Comparative Example C2 utilized PPG-2000 with a molecular weight of 2000 to form a urethane adhesive resin, Comparative Example C3 utilized PPG-3000 with a molecular weight of 3000 to form a urethane adhesive resin, Comparative Example C4 utilized PPG-4000 with a molecular weight of 4000 to form a urethane adhesive resin.

Table 6 shows the compatibility evaluation results of each of the urethane adhesive resins of Table 5 and the urethane adhesive curing agent. Table 6 shows the compatibility evaluation results of each of Examples and Comparative Examples according to the type or kind of urethane adhesive curing agent. The ratio of the urethane adhesive resin and the urethane adhesive curing agent was utilized as 100/2, and when the compatibility was good or suitable, it was marked with 'O', and when the compatibility was poor, it was marked with 'X'.

Referring to Tables 5 and 6, in the case of Comparative Examples C2, C3, and C4, each of which including a polyol having a molecular weight of more than 1000, it can be confirmed that compatibility of each of Comparative Examples C2, C3, and C4 with all urethane adhesive curing agents utilized in the evaluation was poor. On the other hand, it can be confirmed that Example C1 including a polyol on a PET film (thickness 25 μm) as a base film layer by slot die coating to form a coating layer with a thickness of 20 μm, and the coating layer was dried in an oven at 120° C. for 2 minutes to form a urethane adhesive layer, and then physical properties thereof were measured. The initial adhesive force is a value measured after being left at room temperature for 30 minutes, and the adhesive force after aging is a value obtained by measuring the adhesive force after aging at 60° C. for 3 days.

In Example D1, a urethane adhesive layer was formed by utilizing a CORONATE® HX curing agent. In Example D2, a urethane adhesive layer was formed by utilizing a DES-MODURO® Z 4470 curing agent. In Example D3, a urethane adhesive layer was formed by utilizing a KONNATE® L-75 curing agent. In Example D4, a urethane adhesive layer was formed by utilizing a DURANATE® 24A-100 curing agent.

Referring to Table 7, it can be confirmed that Example D1 utilizing the CORONATE HX curing agent had the best physical properties of initial adhesive force, adhesive force after aging, total transmittance (T.T(%)), and haze.

Example and Comparative Examples According to a Polyol Functional Group of an Urethane Adhesive Resin of a Urethane Adhesive Layer

TABLE 8

| Components and Physical properties | Example E1 | Comparative Example E2 | Comparative Example E3 | Comparative Example E4 |
|---|---|---|---|---|
| Urethane adhesive resin with 4 functional groups (KONIX HD-402) | 100 (g) | — | — | — |
| Urethane adhesive resin with 3 functional groups (KONIX GP-400) | — | 100 (g) | — | — |
| Urethane adhesive resin with 5 functional groups (KONIX HS-209) | — | — | 100 (g) | — |
| Urethane adhesive resin with 6 functional groups (KONIX KR-31) | — | — | — | 100 (g) |
| CORONATE HX (g) | 2 | 2 | 2 | 2 |
| Initial adhesive force (gf/in) | 611 | 860 | — | — |
| Adhesive force after aging (gf/in) | 410 | 510 | — | — |
| T.T/HAZE after aging | 96/0.92 | 93/0.97 | — | — | having a molecular weight of 1000 has good or suitable compatibility with all urethane adhesive curing agents utilized in the evaluation.

TABLE 7

| Components and Physical properties | Example D1 | Example D2 | Example D3 | Example D4 |
|---|---|---|---|---|
| Example C1 | | 100 (g) | | |
| CORNATE HX | 2 (g) | — | — | — |
| DESMODUR Z 4470 | — | 2 (g) | — | — |
| KONNATE L-75 | — | — | 2 (g) | — |
| DURANATE 24A-100 | — | — | — | 2 (g) |
| Initial adhesive force (gf/in) | 650 | 920 | 814 | 725 |
| Adhesive force after aging (gf/in) | 480 | 770 | 680 | 610 |
| T.T/HAZE | 97/0.93 | 94/0.98 | 95/1.11 | 93/1.08 |

Table 7 shows the results of measuring the physical properties of the urethane adhesive layers including respective urethane adhesive compositions after preparing urethane adhesive compositions by mixing the urethane adhesive resin of Example C1 shown in Table 5 with each of the different urethane adhesive curing agents. For a urethane adhesive layer, a urethane adhesive composition was coated Table 8 shows the results of measuring the physical properties of the urethane adhesive layers including respective urethane adhesive compositions after preparing urethane adhesive compositions by mixing each of urethane adhesive resins including different types (kinds) of polyol with a urethane adhesive curing agent. For a urethane adhesive layer, a urethane adhesive composition was coated on a PET film (thickness 25 μm) as a base film layer by slot die coating to form a coating layer with a thickness of 20 μm, and the coating layer was dried in an oven at 120° C. for 2 minutes to form a urethane adhesive layer, and then physical properties thereof were measured. The initial adhesive force is a value measured after being left at room temperature for 30 minutes, and the adhesive force after aging is a value obtained by measuring the adhesive force after aging at 60° C. for 3 days.

In Example E1, a urethane adhesive layer was formed by including a urethane adhesive resin including a 4-functional polyol, and in Comparative Example E2, a urethane adhesive layer was formed by including a urethane adhesive resin including a 3-functional polyol. In Comparative Examples E3 and E4, a gelation phenomenon occurred during the synthesis of the urethane adhesive resin, so further physical property tests were not conducted. That is, a gelation phenomenon occurred during the synthesis of the urethane adhesive resin when a polyol having 5 or more functional groups was utilized.

Referring to Table 8, it can be confirmed that Example E1 utilizing a 4-functional polyol had the best properties of initial adhesive force, adhesive force after aging, T.T(%), and haze. In the case of Comparative Example E2 utilizing a polyol of 3 functional groups or less, it can be confirmed that the initial curing is slower than that of Example E1, and the adhesive force and optical properties are lowered after aging.

Examples of Urethane Adhesive Layers According to Catalyst Content (e.g., Amount)

TABLE 9

| Components and Physical properties | Example F1 | Example F2 | Example F3 | Example F4 | Example F5 | Example F6 | Example F7 | Example F8 |
|---|---|---|---|---|---|---|---|---|
| Example C1 Urethane adhesive resin (g) | | | | 100 | | | | |
| CORNATE HX (g) | | | | 2 | | | | |
| 10% DBTDL (g) | 0 | 0.2 | 0.4 | 0.6 | 0.8 | 1 | 1.2 | 1.4 |
| Initial adhesive force (gf/in) | 658 | 630 | 601 | 595 | 575 | 530 | 529 | 525 |
| Adhesive force after aging (gf/in) | 420 | 415 | 421 | 415 | 410 | 411 | 408 | 415 |
| T.T/HAZE | 96/0.91 | 96/0.92 | 97/0.93 | 97/0.91 | 98/0.92 | 100/0.92 | 100/0.91 | 100/0.93 |

Table 9 shows the results of measuring the physical properties of the urethane adhesive layers including respective urethane adhesive compositions after preparing urethane adhesive compositions formed by varying the content (e.g., amount) of the DBTDL catalyst diluted to 10%. Each of examples in Table 9, was formed with the urethane adhesive compositions formed by mixing the DBTDL catalyst diluted to 10% in ethyl acetate, the urethane adhesive resin of Example C1 shown in Table 5, and the urethane adhesive curing agent of CORONATE® HX. For a urethane adhesive layer, a urethane adhesive composition was coated on a PET film (thickness 25 μm) as a base film layer by slot die coating to form a coating layer with a thickness of 20 μm, and the coating layer was dried in an oven at 120° C. for 2 minutes to form a urethane adhesive layer, and then physical properties thereof were measured. The initial adhesive force is a value measured after being left at room temperature for 30 minutes, and the adhesive force after aging is a value obtained by measuring the adhesive force after aging at 60° C. for 3 days.

Referring to Table 9, there was no significant difference in the haze of the examples according to the catalyst content (e.g., amount), but the T.T value had the highest value when the catalyst content (e.g., amount) was 1.

Examples According to a Thermal Curing Temperature of a Urethane Adhesive Layer

TABLE 10

| No. | Maximum drying temperature | T.T (%) | Haze (%) |
|---|---|---|---|
| Example G1 | 130° C. | 91.78 | 0.94 |
| Example G2 | 135° C. | 91.83 | 0.76 |
| Example G3 | 140° C. | 92.05 | 0.58 |

TABLE 10-continued

| No. | Maximum drying temperature | T.T (%) | Haze (%) |
|---|---|---|---|
| Example G4 | 145° C. | 92.02 | 0.61 |
| Example G5 | 150° C. | 92.05 | 0.59 |

Table 10 shows the physical properties measured according to a drying temperature after coating a urethane adhesive composition. The examples of Table 10 were urethane adhesive layers formed by utilizing the same urethane adhesive composition coated on a PET film (thickness of 25 μm) as a base film layer by slot die coating to form a coating layer having a thickness of 20 μm, and varying the thermal curing condition of the coating layer.

At the maximum drying temperature of 145° C. or higher, it was difficult to commercialize the product due to shrinkage and wrinkles of PET, which is a liner base material. It can be confirmed that the optical properties were the best by having a high T.T value and a low haze value at a maximum drying temperature of 140° C. Accordingly, conditions of having a maximum drying temperature of 140° C. or less are preferred.

Example and Comparative Examples According to
the Type or Kind of Lower Exfoliation Layer

TABLE 11

| | Example H1 | Comparative Example H2 | Comparative Example H3 | Comparative Example H4 | Comparative Example H5 | Comparative Example H6 |
|---|---|---|---|---|---|---|
| Products | Off-line-3 50 μm | In-line #1 | In-line #3 | In-line-#2 | Off-line-1 50 μm | Off-line-2 50 μm |
| Release coating layer | — | CY101 | Cy701 | TW31 | — | — |
| Synthetic resin material film | Transparent PET | Transparent PET | Transparent PET | White PET | Transparent PET | Transparent PET |
| T.T | 92.01 | 91.8 | 91.89 | 91.8 | 91.68 | 91.83 |
| Haze | 0.68 | 1.73 | 1.56 | 1.39 | 2.4 | 1.71 |

Table 11 shows the measured physical properties of Examples and Comparative Examples according to the type or kind of lower exfoliation layer. Example H1 is a lower exfoliation layer prepared by coating a silicone release agent on a PET film to form a release coating layer having a thickness in a range of 0.4 μm to 0.8 μm. Comparative Examples H2, H3, and H4 were commercially available in-line PET liners, which are finished products that are release-coated on synthetic resin material films and sold. Comparative Examples H5 and H6 were lower exfoliation layers prepared by coating a silicone release agent on a PET film to form a release coating layer having a thickness of less than 0.4 μm.

Referring to Table 11, it can be confirmed that, in the case of Example H1 in which the thickness of the silicone release coating layer was formed in the range of 0.4 μm to 0.8 μm, it was advantageous to maintain the smoothness of the release coating layer, and the optical properties (T.T, Haze) were the best.

According to embodiments of the present disclosure, when a protective film includes a relatively thin base film, and a hard coating layer including a fluorine-based photocurable resin and a glycol-based photocurable resin, scratch resistance of the protective film may be improved, and curling may be prevented or reduced. However, the scope of the disclosure is not limited by these effects.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As used herein, the term "substantially," "about," and similar terms are used as terms of approximation and not as terms of degree, and are intended to account for the inherent deviations in measured or calculated values that would be recognized by those of ordinary skill in the art. "Substantially" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of "may" when describing embodiments of the present disclosure refers to "one or more embodiments of the present disclosure."

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other nontransitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes or modifications in form and details may be made therein without departing from the spirit and scope as defined by the following claims and equivalents thereof.

What is claimed is:

1. A protective film comprising:
a urethane adhesive layer comprising a urethane adhesive resin;
a base film layer on the urethane adhesive layer; and
a hard coating layer on the base film layer and comprising a fluorine-based photocurable resin and a glycol-based photocurable resin,
wherein, based on a total weight of the hard coating layer, the fluorine-based photocurable resin is in a range of about 3 wt % to about 10 wt %, and the glycol-based photocurable resin is in a range of about 1 wt % to about 8 wt %.

2. The protective film of claim 1, wherein the hard coating layer comprises a urethane photocurable resin and a propane-based photocurable resin.

3. The protective film of claim 2, wherein, based on a total weight of the hard coating layer,
the urethane photocurable resin is in a range of about 10 wt % to about 50 wt %, and
the propane-based photocurable resin is in a range of about 1 wt % to about 15 wt %.

4. The protective film of claim 1, wherein a thickness of the base film layer is in a range of about 15 μm to about 100 μm.

5. The protective film of claim 1, wherein a thickness of the hard coating layer is less than a thickness of the base film layer.

6. The protective film of claim 5, wherein the thickness of the hard coating layer is in a range of about 1 μm to about 10 μm.

7. The protective film of claim 1, further comprising a lower exfoliation layer below the urethane adhesive layer.

8. The protective film of claim 7, wherein the lower exfoliation layer comprises a synthetic resin material film layer and a release coating layer on the synthetic resin material film layer.

9. The protective film of claim 1, further comprising an upper exfoliation layer on the hard coating layer.

10. The protective film of claim 1, wherein the urethane adhesive resin comprises a polyol having a molecular weight in a range of about 400 to about 1000.

11. The protective film of claim 1, wherein the urethane adhesive resin comprises a polyol having four functional groups.

12. A display device comprising:
a display panel;
a cover window on the display panel; and
a protective film on the cover window,
wherein the protective film comprises:
a urethane adhesive layer comprising a urethane adhesive resin;

32 a base film layer on the urethane adhesive layer; and
a hard coating layer on the base film layer and comprising a fluorine-based photocurable resin and a glycol-based photocurable resin,
wherein, based on a total weight of the hard coating layer, the fluorine-based photocurable resin is in a range of about 3 wt % to about 10 wt %, and the glycol-based photocurable resin is in a range of about 1 wt % to about 8 wt %.

13. The display device of claim 12, wherein the display panel comprises a flat area and a curved area bent outside the flat area.

14. The display device of claim 12, wherein the hard coating layer comprises a urethane photocurable resin and a propane-based photocurable resin.

15. The display device of claim 14, wherein, based on a total weight of the hard coating layer,
the urethane photocurable resin is in a range of about 10 wt % to about 50 wt %, and
the propane-based photocurable resin is in a range of about 1 wt % to about 15 wt %.

16. The display device of claim 12, wherein a thickness of the base film layer is in a range of about 15 μm to about 100 μm.

17. The display device of claim 12, wherein a thickness of the hard coating layer is less than a thickness of the base film layer.

18. The display device of claim 12, wherein the urethane adhesive resin comprises a polyol having a molecular weight in a range of about 400 to about 1000.

19. The display device of claim 12, wherein the urethane adhesive resin comprises a polyol having four functional groups.

20. A method of manufacturing a protective film, the method comprising:
applying a base film layer;
forming a hard coating layer on the base film layer, the hard coating layer comprising a fluorine-based photocurable resin and a glycol-based photocurable resin; and
forming a urethane adhesive layer below the base film layer,
wherein, based on a total weight of the hard coating layer, the fluorine-based photocurable resin is in a range of about 3 wt % to about 10 wt %, and the glycol-based photocurable resin is in a range of about 1 wt % to about 8 wt %.

21. The method of claim 20, wherein the forming of the hard coating layer comprises:
manufacturing a hard coating composition comprising the fluorine-based photocurable resin, the glycol-based photocurable resin, a urethane photocurable resin, a propane-based photocurable resin, a solvent, and a photoinitiator;
coating the hard coating composition on the base film layer; and
ultraviolet (UV)-photocuring the coated hard coating composition.

22. The method of claim 21, wherein, based on a total weight of the hard coating composition,
the propane-based photocurable resin is in a range of about 1 wt % to about 15 wt %,
the solvent is in a range of about 30 wt % to about 80 wt %, and
the photoinitiator is in a range of about 0.5 wt % to about 10 wt %.

23. The method of claim 21, wherein the hard coating composition is coated on the base film layer by a micro gravure coating operation.

24. The method of claim 20, wherein the forming of the urethane adhesive layer comprises:

manufacturing a urethane adhesive composition comprising a urethane adhesive resin and a urethane adhesive curing agent;

coating the urethane adhesive composition on a lower portion of the base film layer; and thermally curing the coated urethane adhesive composition.

25. The method of claim 24, wherein the urethane adhesive composition is coated on the lower portion of the base film layer by a slot die coating operation.

26. The method of claim 24, wherein the urethane adhesive resin comprises polypropylene glycol, hexamethylene diisocyanate (HDI), a catalyst, and a solvent, and the urethane adhesive curing agent comprises at least one polyisocyanate selected from the group consisting of an aliphatic polyisocyanate derived from hexamethylene diisocyanate (HDI), an aliphatic polyisocyanate derived from isophorone diisocyanate (IPDI), and an aromatic polyisocyanate derived from toluene diisocyanate (TDI).

27. The method of claim 20, further comprising:

forming a lower exfoliation layer below the urethane adhesive layer; and forming an upper exfoliation layer on the hard coating layer.

28. The method of claim 27, wherein the forming of the lower exfoliation layer comprises:

applying a synthetic resin material film layer; and forming a release coating layer by coating a silicone release agent on the synthetic resin material film layer with a slot die coater.

\*　　\*　　\*　　\*　　\*